United States Patent [19]
Johnson et al.

[11] Patent Number: 5,472,910
[45] Date of Patent: Dec. 5, 1995

[54] PROCESS FOR MAKING OHMIC CONTACTS AND PHOTOVOLTAIC CELL WITH OHMIC CONTACT

[75] Inventors: Daniel R. Johnson, West Byfleet; Sener Oktik, Durham City; Mehmet E. Ozsan, Woking; Michael H. Patterson, Frimley, all of England

[73] Assignee: BP Solar Limited, London, England

[21] Appl. No.: 204,423

[22] PCT Filed: Nov. 6, 1992

[86] PCT No.: PCT/GB92/02052

§ 371 Date: Mar. 16, 1994

§ 102(e) Date: Mar. 16, 1994

[87] PCT Pub. No.: WO93/09568

PCT Pub. Date: May 13, 1993

[30] Foreign Application Priority Data

Nov. 7, 1991 [GB] United Kingdom ............... 9123684

[51] Int. Cl.$^6$ ................. H01L 21/8254; H01L 31/04
[52] U.S. Cl. ................. 437/185; 148/DIG. 64; 136/256; 136/260
[58] Field of Search ................. 437/185, 946; 136/256, 260, 264; 148/17, 64; 257/744

[56] References Cited

U.S. PATENT DOCUMENTS

| | | | |
|---|---|---|---|
| 4,085,500 | 4/1978 | Hager et al. | 437/142 |
| 4,456,630 | 6/1984 | Bosol | 136/260 |
| 4,568,792 | 2/1986 | Mooney et al. | 136/264 |
| 4,650,921 | 3/1987 | Mitchell | 136/260 |
| 4,666,569 | 5/1987 | Bosol | 437/185 |
| 4,684,761 | 8/1987 | Devoney | 437/2 |
| 4,735,662 | 4/1988 | Szabo et al. | 136/256 |
| 4,816,120 | 3/1989 | Ondris et al. | 205/224 |
| 4,909,857 | 3/1990 | Ondris et al. | 136/260 |
| 5,340,409 | 8/1994 | Tsuzuki et al. | 136/256 |

FOREIGN PATENT DOCUMENTS

| | | |
|---|---|---|
| 0274890 | 7/1988 | European Pat. Off. . |
| 0287458 | 10/1988 | European Pat. Off. . |
| 53-138289 | 2/1978 | Japan . |
| 55-102279 | 5/1980 | Japan . |
| 1168073 | 7/1989 | Japan ................. 136/260 |

OTHER PUBLICATIONS

Uda et al, Proceedings of the Sixteenth IEEE Photovoltaic Specialists Conference, Sep. 1982, pp. 801–804.
Ikegami, CdS/CdTe Solar Cells By The Screen–Printing–Sintering Technique: Fabrication, Photovoltaic Properties and Applications, Solar Cells, 23, [1988], pp. 89–105.
Fahrenbruch, Solar Cells, (1987), Jun.–Aug., Nos. 1–4, 399–412.
Clemminck et al, 9th European Photovoltaic Solar Energy Conference, Lisbon, Portugal, Apr. 1991.
Ponpon, Solid State Electronics, 28, No. 7, pp. 689–706 (1985).
Bube, Solar Cells, 23, Nos. 1–2 (Jan.–Feb. 1988) pp. 1–17.
Krishnamurthy et al, J. Vacuum Science & Technology, A8 (Mar./Apr. 1990, No. 2, pp. 1147–1151.
Musa et al, J. Appl. Phys. 54(6), Jun. 1983, 3260–3267.

*Primary Examiner*—George Fourson
*Assistant Examiner*—Thomas G. Bilodeau
*Attorney, Agent, or Firm*—Brooks Haidt Haffner & Delahunty

[57] ABSTRACT

Ohmic contacts to p-type IIB/VIB semiconductor are obtained by a process which includes the step of depositing a viscous liquid containing a Group IB metal salt on a surface of a semiconductor, substantially free of oxide groups, heating to form a dried layer, removing the dried layer, washing the surface to remove residual by-products and drying the surface.

23 Claims, No Drawings

PROCESS FOR MAKING OHMIC CONTACTS AND PHOTOVOLTAIC CELL WITH OHMIC CONTACT

The present invention relates to the production of ohmic contacts to p-type IIB/VIB semiconductor materials.

The production of thin film IIB/VIB semiconductors, e.g. CdTe, by electrodeposition and their use in photovoltaic cells is disclosed in GB 1 532 616.

The use of heat treatment to convert thin films of near intrinsic or n-type semiconductor based on elements of Group IIB of the Periodic Table and Te to p-type semiconductor is disclosed in U.S. Pat. No. 4,388,483.

In order to make photovoltaic cells with good electrical properties it is necessary to make a good ohmic contact to the layer of IIB/VIB semiconductor. U.S. Pat. No. 4,456,530 discloses a method of obtaining good ohmic contacts on p-type semiconductor by etching the semiconductor film surface with an acidic solution, and then etching with a strong basic solution, and finally depositing a metal layer. The acidic etch may be an acid solution of an oxidising agent such as the well-known dichromate etch. The strong basic etch may be hydrazine monohydrate.

We have found that the stability on prolonged light exposure of cells provided with ohmic contacts using the method of U.S. Pat. No. 4,456,530, i.e. their resistance to ageing, is not always as high as is desirable and that the electrical characteristics may be impaired as result of a reduced shunt resistance and increased series resistance.

We have now found an alternative method of providing ohmic contacts to layers of IIB/VIB semiconductors.

According to the present invention a method of making an article having an ohmic contact to p-type IIB/VIB semiconductor is characterised by the successive steps of:

depositing a viscous liquid containing a Group IB metal salt on a surface, substantially free of oxide groups, of the layer of p-type semiconductor, heating the resulting deposit to form a dried layer, removing the dried layer, washing the surface to remove residual by-products, and drying the surface.

The preferred method of applying the invention is to deposit a conductive layer on the surface which has been treated in accordance with the invention. An alternative, less preferred, method is to form a conductive layer, and then to deposit a very thin layer of IIB/VIB semiconductor on the conductive layer. This layer of IIB/VIB semiconductor is then subjected to the treatment of the present invention. Finally a thicker layer of IIB/VIB semiconductor layer is deposited on the treated thin layer of IIB/VIB semiconductor which provides an ohmic contact to the underlying conductive layer.

The semiconductor is a IIB/VIB semiconductor, i.e. a semiconductor containing at least one element from Group IIB and at least one element from Group VIB. In this specification references to IIB and VIB are references to the Periodic Table of the Elements as appearing in "Advanced Inorganic Chemistry" by Cotton & Wilkinson, 4th Edition, in which Group IIB includes Cd, and Group VIB includes Se and Te. The preferred semiconductors are compounds of Cd and Te, which may also contain Hg, as disclosed in U.S. Pat. No. 4,548,681. In addition to compounds of Cd,Te, and Hg it is also possible to use CdTe doped with small quantities of Cu, Ag, and Au as disclosed in EP 244 963.

The p-type semiconductor layer may be a thin film semiconductor, but may also be a single crystal material. It is particularly preferred to apply the process of the present invention to a p-type polycrystalline thin film semiconductor obtained by the heat treatment of a layer of IIB/VIB semiconductor obtained by electrodeposition.

The IIB/VIB semiconductor layer may form part of a multi-layer article intended to be formed into a photovoltaic cell. Such an article may be obtained by depositing CdS on a transparent conducting substrate (for example using electrodeposition or electroless or vacuum deposition), and then electrodepositing the IIB/VIB semiconductor on the CdS layer.

In order to obtain the p-type semiconductor required by the process of the present invention the electrodeposited material is heat-treated using known methods to form p-type material. If the heat treatment is carried out in the presence of a gas containing oxygen such as air then a surface layer containing oxides of Cd and Te is produced. This oxide-containing layer is undesirable and if it is formed the semiconductor is subjected to a treatment to remove it. Thus the oxide-containing surface layer may be removed by a treatment with, for example, a liquid containing a compound which forms a soluble complex or salt with Cd and a salt with Te.

A particularly preferred complexing compound is diaminoethane. The diaminoethane is preferably used diluted, preferably in the form of an aqueous solution. The concentration of diaminoethane in the aqueous solution is preferably in the range 25% to 75% by volume. Another compound which may be used is EDTA (ethylene diamine tetraacetic acid) used as its sodium salt. This may be used as an aqueous solution, for example a 0.1M solution. The pH is preferably 7 or above, e.g. 12.

The oxide removal treatment may be carried out by dipping the IIB/VIB semiconductor layer into a bath containing the treatment liquid. The treatment step may be carried out over a moderately wide range of temperatures e.g. 10° C. to 50° C. The optimum duration of the treatment step is dependent on the concentration of complexing compound in the treatment bath and the temperature. At 20°–25° C. and a diaminoethane concentration of 50% wt by volume in an aqueous solution it may conveniently be in the range 0.5–10 minutes, but more preferably 1–5 minutes.

After any step of removing the oxide-containing surface layer which may be required the viscous liquid containing a Group IB metal salt is deposited on the treated surface. The Group IB metal salt may be a copper salt e.g. a cuprous halide. Among specific salts which may be used are cuprous chloride, cuprous iodide or cupric sulphate.

The viscous liquid may be a liquid containing finely divided solid particles to give it the consistency of a paste.

The paste containing the salt of a Group IB metal salt preferably contains finely divided insulating material in a non-aqueous liquid as a thickening agent. Suitable material for mixing with the salt of the Group IB metal is commercially available as dielectric paste or screenable masking paste. This dielectric paste, or screen printable masking paste, is used in the production of printed circuits to mask areas of the board on which the printed circuit is formed. One such commercially available dielectric paste is believed to comprise colloidal clay in a non-conducting liquid. The materials used must of course be inert to the semiconductor on which they are deposited.

The paste may be formed by the addition of a solution of the metal salt in a non-aqueous liquid for example dimethyl formamide to a pre-formed paste such as the dielectric paste mentioned above. The concentration of the salt in the non-conducting liquid may for example be in the range 0.1–100 mM. This solution may be mixed with a thickened non-aqueous liquid such as a dielectric paste in a volume/mass ratio in the range 100:1 to 1:100, e.g. 10:1 to 1:10, where volume and mass have the same relationship as liters and kilograms.

Alternatively, the viscous liquid may contain a dissolved viscosifying agent such as a non-conducting polymer. An example of a polymer which can be used is polyvinyl pyrrolidone (PVP).

The viscous liquid may be applied to the semiconductor surface by any convenient method e.g. painting with a brush, screen printing, or by spinning, application with a flexible doctor blade, immersion, or spraying to produce a continuous coating on the semiconductor.

The thickness of the viscous liquid layer is not believed to be critical and may for example be 0.1 to 100 micrometers, e.g. 1 to 100 micrometers.

The article which now has a surface layer containing Group IB salt, e.g. cuprous iodide, is subjected to a heat treatment. The heat treatment can be carried out in an inert atmosphere, e.g. nitrogen or argon, or in air or in vacuum (e.g. during or after the application of the paste). The temperature is preferably in the range 50° to 500° C., more preferably 150° to 250° C. The duration of the heat treatment will depend on the temperature but may for example be in the range 1 to 60 minutes.

After the heat treatment step the etched and heat treated layer is subjected to a cleaning step to remove the deposit left by the viscous liquid, e.g. dried paste where a paste is used. Thus dried paste may be removed by immersing the semiconductor surface in a liquid for example butyl acetate and then subjecting the liquid to ultrasonic vibration for 1–10 minutes at 10° to 50° C.

After the removal of the deposited material the semiconductor surface is washed. It is believed that this removes residual by-products e.g. Cd salts. The washing step is carried out with solvents such as methanol or deionized water.

The washing step may be carried out at ambient temperature.

After the washing step the semiconductor layer is dried preferably in an inert atmosphere e.g. by passing a stream of nitrogen atmosphere over it.

A conductive contact is deposited on the treated semiconductor surface. Techniques for depositing conductive contacts are well-known and there is therefore no need to describe these in detail. The conductive contact may for example be Ni, Au, Te, multilayers of two or more metals (e.g. Ni/Cr or Ni/Al), carbon (e.g. graphite/polymer blends), multilayers of carbon with one or more metals, (e.g. Ni/Al) or transparent conductive oxides, e.g. $SnO_2$ (TO) or $In_2O_3$:Sn (ITO).

The invention will now be described by reference to the following experiments in which experiments identified by number are Examples of the invention and experiments identified by letter are comparative tests not according to the invention.

Example 1

A photovoltaic cell was prepared as follows.

A thin film of CdS was chemically deposited on a glass substrate coated with $SnO_2$ by immersing the glass substrate in a warm alkaline solution containing a cadmium complex ($[Cd(NH_3)_4]^{2+}$) and thiourea. The method is disclosed in N. R. Pavaskar, C. A. Menezes, A. P. Sinha, J. Electrochemical Soc. 124 (1967) pp 743. The deposited film was rinsed with DIW (deionized water) and dried with nitrogen. The glass substrate with the deposited CdS layer was then heated at 400° C. in air for 10 minutes.

The glass substrate was immersed in glacial acetic acid as an etchant to remove surface layers on the CdS. In place of glacial acetic acid hydrazine hydrate would have been equally satisfactory.

A thin film of CdTe was electrodeposited over the CdS layer. Conditions for electrodepositing CdTe are disclosed in U.S. Pat. Nos. 4,440,244 and 4,456,630 except that the Te ions were added as $TeO_2$.

The bath electrolyte was an aqueous solution containing 0.5M $Cd^{2+}$, 50 ppm Te, 300 ppm $Cl^-$, and pH about 1.7. Te ions were added by the addition of $TeO_2$ powder. The bath temperature was 70° C.

The electrode potential corrected for resistive losses was held at −0.5 volts relative to the Ag/AgCl reference electrode.

The bath was agitated during the electrodeposition of CdTe on the plate, which took place at a plating current density of about 0.14 mA/cm². The deposition continued for about 4.5 hours.

The glass substrate, now carrying CdS and CdTe layers, was then heat treated as disclosed in U.S. Pat. No. 4,388,483 to change the conductivity type of the CdTe to p-type.

The multi-layer structure obtained as above was immersed in a vessel containing 500 ml of an aqueous solution of diaminoethane (50% diaminoethane by volume in deionized water) at room temperature (about 20° C.) for 2 minutes in order to remove oxide layers from the CdTe layer.

The surface was then washed with deionized water and then dried with a stream of nitrogen.

A paste was then painted on the treated semi-conductor surface. The paste was prepared by mixing a commercially available dielectric paste with a solution of CuI in dimethyl formamide solution (15 mM) in a ratio of 2 g of dielectric paste to 5 ml of CuI solution.

The coated surface was then heated at 180° C. in nitrogen for 35 minutes and then allowed to cool to room temperature.

The multi-layer structure was then immersed in a bath of butyl acetate and ultrasonic vibration was applied to the bath. This removed the paste.

Residual solvent was removed from the structure by washing with deionized water, and blowing dry with nitrogen.

A back contact was then formed on the structure by painting the top surface with a carbon paste to form dots each having an area of 3 mm² to form individual photovoltaic cells. Carbon pastes are commercially available for depositing conducting paths on printed circuits.

The performance of these individual photovoltaic cells formed by deposition of the back contact was measured at room temperature, under an illumination of 100 mW cm⁻² using an ELH type quartz halogen light source with dichroic reflector.

The efficiency of a 3 mm² cell was 11.6% both before and after continuous light soak for 288 hours at an illumination intensity of 100 mW cm⁻² at 70° C.

Comparative Test A

A comparative test was carried using a layered structure of CdS/CdTe produced by electrodeposition of CdTe on CdS and heat treatment, as in Example 1. Instead of the novel treatment of Example 1 the CdTe layer was subjected to an oxidising etch and reducing etch as disclosed in U.S. Pat No. 4,456,630. The etching conditions used were as follows.

The article obtained by depositing CdS and CdTe on the glass coated with tin oxide substrate was dipped in a weak $Br_2$/methanol solution for 5 secs and then rinsed in deionized water, and dried with nitrogen. It was then immersed in an oxidising etch which was a 0.24M solution of a mixture of $Na_2Cr_2O_7.2.5\ H_2O$ and $H_2SO_4.H_2O$ in a ratio of 3:4 by volume, for less than 1 sec. It was then rinsed with deionized water and dried in a stream of nitrogen It was then dipped into a hydrazine monohydrate (60%) solution, rinsed in water and then blown dry with $N_2$. A Cu (3 nm thick) contact followed by a Ni (250 nm) back contact was then formed by vacuum evaporation.

The efficiencies obtained from 10 cells (3 mm$^2$) surface area were 9.2% before light soak of 300 hours (90 mW cm$^{-2}$, 65° C.) and 7.5% after light soak.

We claim:

1. The process of making an article having an ohmic contact to p-type IIB/VIB semi-conductor layer is characterised by the successive steps of: depositing a viscous liquid containing a Group IB metal salt on a surface, substantially free of oxide groups, of the layer of the p-type semi-conductor, heating the resulting deposit to form a dried layer, removing the dried layer, washing the surface to remove residual by-products, and drying the surface, resulting in an ohmic contact to the p-type IIB/VIB semi-conductor.

2. The process according to claim 1 wherein a conductive layer is deposited on the surface having said ohmic contact.

3. The process according to claim 1 wherein the semiconductor is a compound of Cd and Te.

4. The process according to claim 1 wherein the p-type IIB/VIB semiconductor is a thin film.

5. The process according to claim 1 wherein the Group IB metal salt is a copper salt.

6. The process according to claim 1 wherein the copper salt is cuprous iodide or cupric sulphate.

7. The process according to claim 1 wherein the viscous liquid is a paste containing a Group IB salt a finely divided insulating material in a non-aqueous liquid as a thickening agent.

8. The process according to claim 7 wherein the paste is prepared by adding a solution of Group IB metal salt in a non-aqueous liquid to a dielectric paste.

9. The process according to claim 8 wherein the concentration of Group IB metal in the non-aqueous liquid is in the range 0.1–100 mM.

10. The process according to claim 8 wherein the solution of Group IB metal salt is mixed with thickened non-conducting liquid in a ratio of volume of said solution measured in liters to mass of said liquid measured in kilograms in the range of 100:1 to 1:100.

11. The process according to claim 1 wherein the thickness of the viscous liquid deposited on the IIB/VIB semiconductor is in the range 0.1 to 100 micrometers.

12. The process according to claim 1 wherein the heating of the viscous liquid on the surface of the Group IIB/VIB semiconductor is carried out at a temperature in the range 50° C. to 500° C.

13. The process according to claim 12 wherein the temperature is in the range 150° C. to 250° C.

14. The process according to claim 1 wherein the heating step is carried out for a time in the range 1 to 60 minutes.

15. The process according to claim 1 wherein the deposit left after deposition of the viscous liquid and heating the resulting deposit is removed by bringing the deposit into contact with a non-aqueous liquid and applying ultrasonic agitation.

16. The process according to claim 1 wherein the p-type IIB/VIB semiconductor is brought into contact with a liquid which forms a soluble complex or salt with Cd and salt of Te before depositing the viscous liquid.

17. The process according to claim 16 wherein the IIB/VIB semiconductor is brought into contact with an aqueous solution of diaminoethane or a salt of ethylene diamine tetraacetic acid before depositing the viscous liquid.

18. A process according to claim 3 wherein the viscous liquid is a paste containing a copper salt and finely divided insulating material in a non-aqueous liquid as a thickening agent and the heating of the viscous liquid on the surface of the semiconductor is at a temperature in the range of 50° C. to 500° C. to form a dried layer.

19. A process according to claim 18 wherein before depositing a viscous liquid, the semi-conductor is brought into contact with a liquid, which forms a soluble complex or salt with Cd and a salt of Te, and after the depositing and heating, the dried layer is removed by bringing into contact with a non-aqueous liquid and applying ultrasonic agitation.

20. A process as claimed in claim 1 wherein said viscous liquid is a dielectric paste.

21. A process as claimed in claim 20 wherein the Group 1B metal salt is a copper salt.

22. A process as claimed in claim 20 wherein the deposit left after deposition of the dielectric paste and heating the resulting deposit is removed by bringing the deposit into contact with a non-aqueous liquid and applying ultrasonic agitation.

23. A thin film photovoltaic device comprising.

(a) a transparent conducting layer (b) a CdS layer (c) a p-type IIB/VIB semi-conductor layer (d) an ohmic contact to the IIB/VIB semi-conductor layer, wherein the ohmic contact is obtained by the successive steps of: depositing a viscous liquid containing a Group 1B metal salt on a surface, substantially free of oxide groups of the layer of the p-type semi-conductor; heating the resulting deposit to form a dried layer; removing the dried layer; washing the surface to remove residual by-products, and drying the surface.

* * * * *

UNITED STATES PATENT AND TRADEMARK OFFICE
CERTIFICATE OF CORRECTION

PATENT NO. : 5,472,910
DATED : December 5, 1995
INVENTOR(S) : DANIEL R. JOHNSON, SENER OKTIK, MEHMET E. OZSAN and MICHAEL H. PATERSON It is certified that error appears in the above-indentified patent and that said Letters Patent is hereby corrected as shown below:

Column 5,
Claim 7, line 2, after "salt" and before "a" insert --and--

Signed and Sealed this

Twenty-sixth Day of March, 1996

BRUCE LEHMAN

Attest:

Attesting Officer     Commissioner of Patents and Trademarks